United States Patent [19]

Hankey et al.

[11] Patent Number: 4,717,690
[45] Date of Patent: Jan. 5, 1988

[54] OVERGLAZE INKS

[75] Inventors: Dana L. Hankey, Santa Barbara, Calif.; Robert C. Sutterlin, Aston, Pa.

[73] Assignee: Heraeus, Inc. Cermalloy Division, W. Conshohocken, Pa.

[21] Appl. No.: 828,938

[22] Filed: Feb. 12, 1986

[51] Int. Cl.$^4$ ............................................. C03C 8/16
[52] U.S. Cl. ................................. 501/20; 501/14; 501/17; 501/30; 501/49; 501/77
[58] Field of Search ................... 501/20, 17, 49, 14, 501/30, 77

[56] References Cited

U.S. PATENT DOCUMENTS

| | | | |
|---|---|---|---|
| 2,889,238 | 6/1959 | Long | 501/20 |
| 3,005,721 | 10/1961 | Cerulli | 501/49 |
| 3,277,020 | 10/1966 | Tanakirama-Rao | 501/17 |
| 3,901,719 | 9/1975 | Brydges, III et al. | 501/49 X |
| 4,377,642 | 3/1983 | Prabhu et al. | 501/20 |
| 4,401,709 | 8/1983 | Prabhu et al. | 428/209 |
| 4,521,250 | 6/1985 | Kuzel et al. | 501/20 X |
| 4,537,703 | 8/1985 | Hormadaly | 501/17 |

FOREIGN PATENT DOCUMENTS

| | | | |
|---|---|---|---|
| 2121326 | 1/1972 | Fed. Rep. of Germany | 501/77 |
| 2545474 | 4/1976 | Fed. Rep. of Germany | 501/20 |
| 45-12504 | 5/1970 | Japan | 501/49 |
| 55-51735 | 4/1980 | Japan | 501/20 |
| 57-77041 | 5/1982 | Japan | 501/17 |
| 59-195552 | 11/1984 | Japan | 501/20 |
| 60-46949 | 3/1985 | Japan | 501/20 |
| 60-60967 | 4/1985 | Japan | 501/20 |

*Primary Examiner*—Mark L. Bell
*Assistant Examiner*—A. Knab
*Attorney, Agent, or Firm*—Sprung Horn Kramer & Woods

[57] ABSTRACT

An overglaze ink comprising
(a) 55 to 70 weight % of a glass composition, the glass composition comprising
 (1) 15 to 43 weight % of a main glass component selected from the group consisting of BaO, SrO and SrO+BaO,
 (2) a glass forming component comprising
 34 to 45 weight % $B_2O_3$ and
 0 to 6 weight % $SiO_2$
 (3) 0 to 2 weight % of a colorant selected from the group consisting of $Cr_2O_3$, CoO and NiO,
 (4) 7 to 20 weight % of a thermal expansion modifier selected from the group consisting of ZnO, $Al_2O_3$, $TiO_2$ and mixtures thereof, and
 (5) 1 to 7 weight % of a dopant comprising one or more of the following:
 $ZnF_2$ having a weight % of 0 to 5,
 $Li_2O$ having a weight % of 0 to 2,
 $Na_2O$ having a weight % of 0 to 2,
 $K_2O$ having a weight % of 0 to 2,
 LiF having a weight % of 0 to 2,
 NaF having a weight % of 0 to 2,
 KF having a weight % of 0 to 2,
 $BaF_2$ having a weight % of 0 to 2,
 $Na_2SiF_6$ having a weight % of 0 to 2,
 PbO having a weight % of 0 to 3,
 $V_2O_5$ having a weight % of 0 to 2,
 $BiO_3$ having a weight % of 0 to 2, and
(b) 30 to 45 weight % of an organic vehicle. The overglaze ink is useful in constructing rigid multilayer integrated circuits on substrate materials, particularly alumina.

23 Claims, No Drawings

OVERGLAZE INKS

BACKGROUND OF THE INVENTION

The present invention concerns thick-film overglaze inks and their use as a protective layer for electrical circuit structures, particularly multilayer designs and resistor networks on ceramic, preferably alumina, substrates.

The use of specialized ink formulations to form thick films having various functions on suitable substrates in the construction of multilayer integrated circuit structures is known in the art. Such technology is of increasing interest in the fabrication of very dense multilayer circuit patterns on various substrates for a wide variety of applications in the electronics industry.

U.S. Pat. No. 4,401,709 describes a thick-film overglaze ink comprising 60 to 90 weight % of a glass powder and 8 to 35 weight % of an organic vehicle. The glass powder of U.S. Pat. No. 4,401,709 is described as containing (a) 58 to 66 weight % of lead oxide, (b) 12 to 20% of a modifier consisting of (i) 2 to 6 weight % cadmium oxide, (ii) 4 to 8 weight % zinc oxide, (iii) 0.1 to 3 weight % barium oxide and (iv) 0.1 to 3 weight % antimony trioxide and (c) 20 to 27 weight % of a glass forming component consisting of (i) 0.1 to 2 weight % aluminum oxide, (ii) 14 to 20 weight % boron trioxide and (iii) 1 to 7 weight % silicon dioxide.

Overglaze inks are utilized to provide mechanical and environmental protection for the portion of films of various functions predominately resistor and conductor films which is not otherwise covered, e.g., by components.

It is generally recognized that overglaze films formed from inks such as herein described should possess: a thermal coefficient of expansion reasonably close to the substrate being utilized and, preferably, also reasonably close to that of the various functional films making up the circuit; good mechanical strength; minimal porosity in general and no through porosity; and most importantly, good chemical compatibility with the underlying conductor and resistor films.

Overglaze inks conventionally contain lead oxide to lower the firing temperature substantially below that of the functional films already on the board. The inherent disadvantage in a high lead content, however, is that increasing the lead content, however, is that increasing the the lead content of the ink also increases the probability of surface chemical reduction of the lead oxide when fired in an inert, e.g., nitrogen, atmosphere. Surface reduction of the lead oxide will interfere with sintering and reduce the flow of the ink. This latter problem is the more serious one since an ink fired in nitrogen must flow as it would if fired in air. The invention of the present application basically involves a low lead content (<3 weight percent) overglaze composition.

It also must be appreciated that an overglaze ink must not react to a significant extent with any part of the circuit on the board. This is particularly true with resistors, since such reaction will normally have an adverse effect on the stability and resistance values of the resistors. To be acceptable, an overglaze film should not change the value of a resistor by more than five percent. A change of plus or minus two percent is the normal industry standard. Films formed from the novel overglaze inks of this invention readily fall within this standard acceptance criteria.

Although, in some instances, overglaze inks are fired at the same time as the underlying conductors and resistors, for reasons of economy, they are generally independently fired at peak temperatures substantially below the firing temperature of conductor and resistor films. Some conventional inks are fireable in only air or nitrogen.

SUMMARY OF THE INVENTION

It is an object of the present invention to provide an overglaze composition with a relatively low lead content, e.g., of 3 weight percent or less.

It is another object of the present invention to provide overglaze inks to form films which conform to industry standards for resistance values for resistors.

It is a further object of the present invention to provide overglaze inks which can be fired in both air or inert environments, e.g., nitrogen.

It is still another object of the present invention to provide overglaze inks which are capable of being fired at peak temperatures of 590° C. to 640° C.

The above objects and other objects and advantages are fulfilled by the present invention.

The thick film overglaze inks provided in accordance with this invention comprise (a) a glass including barium and/or strontium oxides, (b) a boron or borosilicate glass-forming component, (c) dopants, e.g., zinc, lithium, potassium, sodium, lead and vanadium, (d) optional modifying components, e.g., chromium, zirconium, aluminum, and titanium, (e) optional colorant oxides, e.g., chromium, cobalt, and nickel, and (f) an appropriate organic vehicle.

The present invention concerns an overglaze ink comprising (a) 55 to 70 weight % of a glass composition, based on the total weight of the overglass ink, the glass composition comprising (1) 15 to 43 weight %, based on the total weight of the glass composition of a main glass component selected from the group consisting of BaO, SrO and SrO+BaO, (2) a glass forming component comprising
34 to 45 weight % $B_2O_3$ and
0 to 6 weight % $SiO_2$ (3) 0 to 2 weight %, based on the total weight of the glass composition of a colorant selected from the group consisting of $Cr_2O_3$, CoO and NiO, (4) 7 to 20 weight %, based on the total weight of the glass composition of a thermal expansion modifier selected from the group consisting of ZnO, $Al_2O_3$, $TiO_2$ and mixtures thereof, and (5) 1 to 5 weight %, based on the total weight of the glass composition of a dopant comprising one or more of the following:
$ZnF_2$ having a weight % of 0 to 5,
$Li_2O$ having a weight % of 0 to 2,
$Na_2O$ having a weight % of 0 to 2,
$K_2O$ having a weight % of 0 to 2,
LiF having a weight % of 0 to 2,
NaF having a weight % of 0 to 2,
KF having a weight % of 0 to 2,
$BaF_2$ having a weight % of 0 to 2,
$Na_2SiF_6$ having a weight % of 0 to 2,
PbO having a weight % of 0 to 3,
$V_2O_5$ having a weight % of 0 to 2,
$BiO_3$ having a weight % of 0 to 2, and (b) 30 to 40 weight %, based on the total weight of the overglaze ink of an organic vehicle.

DETAILED DESCRIPTION OF THE INVENTION

The present invention pertains to a novel overglaze ink which is suitable for use as a protective layer for multilayer electrical circuit structures.

The overglaze ink of the present invention is composed of (a) 55 to 70 weight %, preferably 60 to 70 weight %, based on the total weight of the overglaze ink of a glass composition and (b) 30 to 45 weight %, preferably 33 to 37 weight %, based on the total weight of the overglaze ink, of an organic vehicle.

The glass composition of the present invention is composed of (a) 15 to 43 weight %, preferably 20 to 38 weight %, based on the total weight of the glass composition, of a main glass component selected from the group of SrO, BaO and SrO+BaO;

(b) a glass forming component comprising 34 to 45 weight %, preferably 36 to 42 weight % $B_2O_3$, based on the total weight of the glass composition, and 0 to 6 weight %, preferably 1 to 4 weight % silica ($SiO_2$), based on the total weight of the glass composition;

(c) 0 to 2 weight %, preferably 0.5 to 2 weight %, based on the total weight of the glass composition, of a colarant (color imparter) selected from the group of $Cr_2O_3$, CoO and NiO, preferably $Cr_2O_3$ (the $Cr_2O_3$ can also function as a modifier);

(d) 7 to 20 weight %, preferably 15 to 20 weight %, based on the total weight of the glass composition, of a thermal expansion modifier selected from the group of ZnO, $Al_2O_3$ and $TiO_2$ and mixtures thereof, preferably ZnO; and (e) 1 to 7 weight %, preferably 4 to 6 weight % of a dopant comprising one or more of the following:

|  | operational range | preferred range |
| --- | --- | --- |
| $ZnF_2$ | 0 to 5 weight % | 0.5 to 2 weight % |
| $Li_2O$ | 0 to 2 weight % | 0.25 to 1.5 weight % |
| $Na_2O$ | 0 to 2 weight % | 0.25 to 1.5 weight % |
| $K_2O$ | 0 to 2 weight % | 0.25 to 1.5 weight % |
| LiF | 0 to 2 weight % | 0.25 to 1.5 weight % |
| NaF | 0 to 2 weight % | 0.25 to 1.5 weight % |
| KF | 0 to 2 weight % | 0.25 to 1.5 weight % |
| $BaF_2$ | 0 to 2 weight % | 0.25 to 1.5 weight % |
| $Na_2SiF_6$ | 0 to 2 weight % | 1 to 2 weight % |
| PbO | 0 to 3 weight % | 0 to 2 weight % |
| $V_2O_5$ | 0 to 2 weight % | 0.5 to 2 weight % |
| $BiO_3$ | 0 to 2 weight % | 0.5 to 2 weight % |

The glass is prepared by mixing together the glass components such as in the form of conventional ceramic oxides, carbonates, fluorides or silicofluoride raw materials in a V-blender. Suitable raw materials include: Group IA and IIA oxides, carbonates and/or fluorides, lead oxide, or vanadium oxide. The raw material mix can be charged into a glass melting furnace at temperatures between 1,000° C. and 1,300° C. to produce a vitreous glass solution. The glass is subsequently fritted by water quenching. The frit is ground into powder by conventional grinding methods (ball milling). The result of this process is a homogeneous glass powder.

Appropriate colorant and/or modifiers are added to the glass powder and thoroughly combined with the glass powder by repeating the aforementioned grinding process.

The modifier component can be an oxide, such as $Cr_2O_3$, $TiO_2$, $ZrO_2$, $Al_2O_3$ and mixtures thereof. The preferred oxide is $Cr_2O_3$, which can be used both to modify the glass melting point and also to impact a green color. A second preferred modifier is $Cr_2O_3$ plus $TiO_2$. The ink formulations of this invention may also contain a minor amount of a conventional colorant oxide such as the oxides of chromium, cobalt, nickel and the like.

The glass frit/colorant/modifier mixture is combined with an organic vehicle to produce a paste of 60–70 weight percent solids. The glass/oxide/vehicle mixture is then three roll milled into a homogeneous paste that can be applied by any conventional mode, i.e., screen printing, brushing, spraying, with screen printing being preferred.

The overglaze inks of this invention are generally fired at peak temperatures of 590° C. to 620° C. and are unique in that they can be fired in either air or, preferably, inert environments, e.g., nitrogen. Since most conventional inks are firable in only one of these environments, the capacity of the subject inks to be fired in either is particularly advantageous in the production of highly complex multilayer circuits.

An organic vehicle is a medium which volatilizes at a fairly low temperature (approximately 400° C. to 500° C.), without causing reduction of other paste components. An organic vehicle acts as a transfer medium for screen printing. An organic vehicle for use in the present invention is preferably a resin, e.g., an acrylic ester resin, preferably an isobutyl methacrylate, and a solvent, e.g., an alcohol, preferably tri-decyl alcohol ("TDA"). The resin can be any polymer which depolymerizes at or below 400° C. in nitrogen. Other solvents that can be employed are terpineol or "TEXANOL" of Eastman Kodak, Rochester, N.Y., U.S.A. The solvent for utilization in the present invention can be any solvent which dissolves the respective resin and which exhibits a suitable vapor pressure consistent with subsequent milling and screen printing. In a preferred embodiment, the organic vehicle is 10 to 40 weight percent isobutyl methacrylate and 90 to 60 weight percent TDA.

The overglaze inks of this invention are applied to the substrate, preferably alumina, to overlay a portion of single or multilayer electronic circuits already in place. The inks may be applied by any conventional mode, i.e., drying, screen printing, brushing, spraying, and the like, with screen printing being preferred. Generally, one or two layers of overglaze would be utilized. For resistors, generally one layer would be used. For hermetitic packaging one or two layers would be used. The second layer would serve to minimize the possibility of pinholes and provide maximum protection. The layers are individually dried and fired. Each coating of ink is dried in air at 125° C. to 150° C. for about 15 minutes. The resulting film may then be fired at a peak temperature of from 590° C. to 640° C., preferably at 600° C. to 620° C. for 2 to 3, minutes in either air or nitrogen. The overglaze films thus obtained have excellent mechanical strength, good thermal stability and a minimal effect on sheet resistance values of resistors in the circuit. The overglaze films of the present invention have demonstrated a significant capacity to reduce resistance drifts due to abrasion, solder dipping and exposure to heat and humidity.

The following Examples further illustrate this invention, it being understood that the invention is in no way intended to be limited to the details described therein.

EXAMPLE 1

A. Preparation of Glass Frit of the Following Composition:

|  | weight % |
|---|---|
| BaO | 34.25 |
| $B_2O_3$ | 39.25 |
| ZnO | 19.57 |
| $Cr_2O_3$ | 0.98 |
| $ZnF_2$ | 0.98 |
| $Li_2O$ | 1.17 |
| LiF | 0.98 |
| PbO | 1.56 |
| $V_2O_5$ | 1.27 |

The following powders were combined and melted at 1,000° C. to 1,100° C. to form a homogeneous glass solution:

|  |  | weight in grams |
|---|---|---|
| $BaCO_3$ | Fisher (King of Prussia, PA, U.S.A.) Certified A.C.S. precipitated B-30 | 1351.40 |
| $B_2O_3$ | Fisher purified A-76 | 1203.30 |
| ZnO | Fisher certified A.C.S. (dry process) Z52 | 600.00 |
| $Cr_2O_3$ | Alfa (Danvers, MA, U.S.A.) 99% pure −325 mesh | 30.00 |
| $ZnF_2$ | Alfa 99% pure anhydrous | 30.00 |
| $Li_2CO_3$ | Fisher certified A.C.S. 99.4% pure L-119 | 89.20 |
| LiF | Alfa 99% | 30.00 |
| PbO | Fisher Mono-Yellow certified L-71 | 47.77 |
| $V_2O_5$ | Fisher technical V-5 | 38.10 |

Carbonates of barium or lithium were utilized.

Alternatively, oxides could have been used. The appropriate batch factors were 1.287 for barium oxide to barium carbonate and 2.477 for lithium oxide to lithium carbonate.

The powders were dry blended in a V blender for two hours. The powder was then loaded into mullite crucibles.

Fritting was then conducted as follows:

(a) The mullite crucibles of powder were preheated at 600° C. for 30 minutes before ramping the temperature up to 1050° C. (elapsed time 2 hours in a Lindberg furnace 51894 1100° C. maximum). After a 15 minute dwell at 1050° C., complete solvation was observed and the glass was fritted by water quenching.

(b) Ball Milling Procedure

Following the decantation of the deionized water, the frit was placed into a ceramic ball mill with alumina ball grinding media in isopropyl alcohol (IPA). The frit was ball milled to achieve the proper particle size and wet sieved through a 200 mesh screen. The material was poured into metal pans and dried overnight in a forced air dryer. The material was then placed in a 150° C. oven for several hours to drive off any water that may have been present.

Modifier was added as follows:

3.75% $Cr_2O_3$ (Alfa −325 mesh) was added to the above-described frit composition powder and then milled for an additional 24 hours under standard conditions. Analysis of the modified powder frit composition:

(i) TMA: 515° C.±5° C.

(ii) Sedigraph:

90% 6.9 microns
50% 3.6 microns
10% 1.5 microns

B. Preparation of A Paste

The glass/modifier mixture was combined with an appropriate quantity of acryloid vehicle. The vehicle is a mixture of B-67 "acryloid" resin (an isobutyl methacrylate produced by Rohm & Haas of Philadelphia, Pa., U.S.A.) and TDA (tridecanol).

The glass and vehicle were blended by a Hobart mixer until suitable for three roll milling. The paste was then three roll milled until smooth. (fineness of grain "f.o.g.", <10 microns).

The % solids and viscosity were then determined to be as follows:

% solids: 65%±1.0%

Viscosity: 40 kcps±5 kcps Ferranti Shirley, small truncated cone, 240s sweep spring constant 2.0

The vehicle had the following composition:

|  | weight % |
|---|---|
| B67 "ACRYLOID" | 35% |
| Tridecyl alcohol (TDA) | 65% |

The viscosity of the vehicle was determined using a Ferranti-Shirley viscometer.

Viscosity 15 kcps: Ferranti Shirley, medium truncated cone 240s sweep.

The resultant overglaze ink can be used as a protective resistor overglaze designed to process at 600° C. -610° C. in nitrogen with minimal resistance change and has the following properties:

Viscosity: 40 kcps, Ferranti-Shirley

Printing: 325 mesh screen, 7-8 microns fired

Drying: Conventional or infrared (IR) belt drying at 150° C.

| Resistance (ohms/square) | % Change in Resistance |
|---|---|
| 500 | +5 |
| 1 K | +4 |
| 10 K | +3 |
| 100 K | +6 |
| 1 M | +7 |

EXAMPLES 2 TO 11

Glass frits of the following compositions were prepared as described above in Example 1:

| Component | 2 | 3 | 4 | 5 | 6 | 7 | 8 | 9 | 10 | 11 |
|---|---|---|---|---|---|---|---|---|---|---|
| SrO | 37.18 | — | — | — | — | — | — | — | 17.15 | — |
| BaO | — | 37.15 | 37.15 | 33.93 | 33.93 | 34.93 | 33.27 | 34.25 | 17.15 | 31.25 |
| $B_2O_3$ | 39.14 | 39.10 | 39.10 | 39.92 | 39.92 | 39.92 | 39.14 | 39.53 | 39.14 | 36.25 |
| ZnO | 19.57 | 19.55 | 19.55 | 18.96 | 18.46 | 17.96 | 19.57 | 19.57 | 19.57 | 19.57 |
| $Cr_2O_3$ | 0.98 | 0.98 | 0.98 | 0.50 | 0.50 | 2.00 | 0.49 | 0.98 | 0.98 | 0.98 |
| $ZnF_2$ | 0.98 | 1.47 | 0.98 | — | 1.00 | 1.00 | — | 0.98 | 0.98 | 0.98 |

-continued

| Component | Example No. | | | | | | | | | |
|---|---|---|---|---|---|---|---|---|---|---|
| | 2 | 3 | 4 | 5 | 6 | 7 | 8 | 9 | 10 | 11 |
| $Li_2O$ | 1.17 | 1.76 | 1.17 | 1.20 | 1.20 | 1.20 | 1.17 | 1.17 | 1.17 | 1.17 |
| LiF | 0.98 | — | 0.98 | — | 1.00 | 1.00 | 0.98 | 0.98 | 0.98 | 0.98 |
| $Bi_2O_3$ | — | — | — | 2.00 | 2.00 | — | 1.96 | — | — | — |
| PbO | — | — | — | 2.00 | 2.00 | 2.00 | 1.96 | 2.55 | 1.56 | 1.56 |
| $V_2O_5$ | — | — | — | — | — | — | — | — | 1.27 | 1.27 |
| $BaF_2$ | — | — | — | 1.5 | — | — | 1.47 | — | — | — |
| $SiO_2$ | — | — | — | — | — | — | — | — | — | 6.00 |

Properties of the above glasses were as follows:

| | Tg range, °C. | Processing T, °C. |
|---|---|---|
| Example 2: | 525–540 | 610 |
| Example 3: | 530–550 | 620 |
| Example 4: | 525–540 | 615 |
| Example 5: | 540–560 | 610 |
| Example 6: | 520–540 | 610 |
| Example 7: | 520–540 | 610 |
| Example 8: | 530–550 | 610 |
| Example 9: | 530–550 | 610 |
| Example 10: | 525–540 | 610 |
| Example 11: | 535–555 | 620 |

$SiO_2$ in Example 11 was obtained from Fisher (King of Prussia, Pa, U.S.A.), floated powder, S153.

It will be appreciated that the instant specification and claims are set forth by way of illustration and not limitation, and that various modifications and changes may be made without departing from the spirit and scope of the present invention.

What is claimed is:

1. An overglaze ink consisting essentially of
   (a) 55 to 70 weight % of a glass composition, the glass composition consisting essentially of
      (1) 15 to 43 weight % of a main glass component selected from the group consisting of BaO, SrO and SrO+BaO,
      (2) a glass forming component consisting essentially of
         34 to 45 weight % $B_2O_3$ and
         0 to 6 weight % $SiO_2$
      (3) 0 to 2 weight % of a colorant selected from the group consisting of $Cr_2O_3$, Co and NiO,
      (4) 7 to 20 weight % of a thermal expansion modifier consisting essentially of $TiO_2$, and
      (5) 1 to 7 weight % of a dopant consisting essentially of one or more of the following:
         $ZnF_2$ having a weight % of 0 to 5,
         $Li_2O$ having a weight % of 0 to 2,
         $Na_2O$ having a weight % of 0 to 2,
         $K_2O$ having a weight % of 0 to 2,
         LiF having a weight % of 0 to 2,
         NaF having a weight % of 0 to 2,
         KF having a weight % of 0 to 2,
         $BaF_2$ having a weight % of 0 to 2,
         $Na_2SiF_6$ having a weight % of 0 to 2,
         PbO having a weight % of 0 to 3,
         $V_2O_5$ having a weight % of 0 to 2, and
         $BiO_3$ having a weight % of 0 to 2, and
   (b) 30 to 45 weight % of an organic vehicle.

2. An overglaze ink according to claim 1, wherein the glass composition is contained in an amount of 60 to 70 weight %.

3. An overglaze ink according to claim 1, wherein the modifier is contained in an amount of 15 to 20 weight %.

4. An overglaze ink according to claim 1, wherein the main glass component is contained in an amount of 20 to 38 weight %.

5. An overglaze ink according to claim 1, wherein the $B_2O_2$ is contained in an amount of 36 to 42 weight %.

6. An overglaze ink according to claim 1, wherein the colorant is contained in an amount of 0.5 to 2 weight %.

7. An overglaze ink according to claim 1, wherein the $SiO_2$ is contained in an amount of 1 to 4 weight %.

8. An overglaze ink according to claim 1, wherein the colorant is $Cr_2O_3$.

9. An overglaze ink according to claim 1, wherein the organic vehicle is contained in an amount of 33 to 37 weight %.

10. An overglaze ink according to claim 1, wherein the dopant comprises one or more of the following:
    0.5 to 2 weight % $ZnF_2$,
    0.25 to 1.5 weight % $Li_2O$,
    0.25 to 1.5 weight % $Na_2O$,
    0.25 to 1.5 weight % $K_2O$,
    0.25 to 1.5 weight % LiF,
    0.25 to 1.5 weight % NaF,
    0.25 to 1.5 weight % KF,
    0.25 to 1.5 weight % $Ba_2F$,
    1 to 2 weight % $Na_2SiF_6$,
    0 to 2 weight % PbO,
    0.5 to 2 weight % $V_2O_5$, and
    0.5 to 2 weight % $BiO_3$.

11. An overglaze ink according to claim 1, wherein the organic vehicle comprises a resin and a solvent.

12. An overglaze ink according to claim 11, wherein the resin is isobutyl methacrylate.

13. An overglaze ink according to claim 11, wherein the solvent is an alcohol.

14. An overglaze ink according to claim 13, wherein the alcohol is tri-decyl alcohol.

15. An overglaze ink according to claim 1, wherein the dopant is contained in an amount of 4 to 6 weight %.

16. An overglaze ink according to claim 1, wherein the dopant consists essentially of one or more of the following:
    0.25 to 1.5 weight % $K_2O$,
    0.25 to 1.5 weight % LiF,
    0.25 to 1.5 weight % NaF,
    0.25 to 1.5 weight % KF,
    0.25 to 1.5 weight % $Ba_2F$,
    1 to 2 weight % $Na_2SiF_6$,
    0.5 to 2 weight % $V_2O_5$, and
    0.5 to 2 weight % $BiO_3$.

17. An overglaze ink according to claim 1, wherein the dopant consists essentially of $ZnF_2$, $Li_2O$ and LiF.

18. An overglaze ink according to claim 1, wherein the dopant consists essentially of $ZnF_2$ and $Li_2O$.

19. An overglaze ink according to claim 1, wherein the dopant consists essentially of $Li_2O$, $Bi_2O_3$, PbO and $BaF_2$.

20. An overglaze ink according to claim 1, wherein the dopant consists essentially of $ZnF_2$, $Li_2O$, $LiF$, $Bi_2O_3$ and $PbO$.

21. An overglaze ink according to claim 1, wherein the dopant consists essentially of $ZnF_2$, $Li_2O$, $LiF$, and $PbO$.

22. An overglaze ink according to claim 1, wherein the dopant consists essentially of $ZnF_2$, $Li_2O$, $LiF$, $PbO$ and $V_2O_5$.

23. An overglaze ink according to claim 1, wherein the dopant consists essentially of $ZnF_2$, $Li_2O$, $LiF$, $PbO$, $V_2O_5$ and $Bi_2O_3$.

* * * * *